United States Patent
Ye

(10) Patent No.: US 8,373,233 B2
(45) Date of Patent: Feb. 12, 2013

(54) HIGHLY N-TYPE AND P-TYPE CO-DOPING SILICON FOR STRAIN SILICON APPLICATION

(75) Inventor: Zhiyuan Ye, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 361 days.

(21) Appl. No.: 12/270,700

(22) Filed: Nov. 13, 2008

(65) Prior Publication Data

US 2010/0117154 A1 May 13, 2010

(51) Int. Cl.
*H01L 21/70* (2006.01)

(52) U.S. Cl. ........ 257/368; 257/344; 257/E21.102; 438/288; 438/300; 438/301

(58) Field of Classification Search .......... 257/E21.102, 257/368, 344; 438/149, 300, 288, 301
See application file for complete search history.

(56) References Cited

U.S. PATENT DOCUMENTS

| | | | | |
|---|---|---|---|---|
| 4,462,151 A | * | 7/1984 | Geipel et al. | 438/220 |
| 4,969,031 A | * | 11/1990 | Kobayashi et al. | 257/64 |
| 5,045,486 A | * | 9/1991 | Chittipeddi et al. | 438/231 |
| 2006/0151832 A1 | * | 7/2006 | Murthy et al. | 257/344 |
| 2006/0160314 A1 | * | 7/2006 | Arghavani | 438/285 |
| 2006/0216876 A1 | * | 9/2006 | Kim et al. | 438/149 |

\* cited by examiner

*Primary Examiner* — John C Ingham
(74) *Attorney, Agent, or Firm* — Kilpatrick Townsend & Stockton LLP

(57) ABSTRACT

A semiconductor device includes a gate, a source region and a drain region that are co-doped to produce a strain in the channel region of a transistor. The co-doping can include having a source and drain region having silicon that includes boron and phosphorous or arsenic and gallium. The source and drain regions can include co-dopant levels of more than $10^{20}$ atom/cm$^3$. The source region and drain region each can be co-doped with more boron than phosphorous or can be co-doped with more phosphorous than boron. Alternatively, the source region and drain region each can be co-doped with more arsenic than gallium or can be co-doped with more gallium than arsenic. A method of manufacturing a semiconductor device includes forming a gate on top of a substrate and over a nitrogenated oxide layer, etching a portion of the substrate and nitrogenated oxide layer to form a recessed source region and a recessed drain region, filling the recessed source region and the recessed drain region with a co-doped silicon compound. The co-doped silicon compound can include silicon, boron and phosphorous or can include silicon, arsenic and gallium. The co-doped silicon compound can be epitaxially grown in the recesses.

17 Claims, 8 Drawing Sheets

HIGHLY N-TYPE AND P-TYPE CO-DOPING SILICON FOR STRAIN SILICON APPLICATION

BACKGROUND OF THE INVENTION

The present invention relates generally to semiconductor devices and specifically to transistors having stress induced channel regions and methods of making transistors having stress induced channel regions.

Advances in transistor designs have discovered that creating a stress in the channel region of a transistor, which is located under the gate and in between the source and drain, results in a transistor having advantages electrical properties. Various methods have been used to create the stress in the channel region of the transistor including using silicon-germanium as the source and drain materials for PMOS. Other examples of materials used to create stress in the channel region include using source and drain material made of silicon and carbon in NMOS.

Although doping silicon with germanium or carbon does improve some of the electrical properties of the transistor, there are problems with using these dopants. For example, using germanium to create silicon-germanium (Si—Ge) source and drain regions causes stress related problems. For example, the problem with Si—Ge is that at high Ge concentrations>30% Si—Ge tends to relax under thermal processes. Using carbon to create silicon-carbon (Si—C) source and drain regions creates meta-stable transistors wherein the carbon migrates out. The problem is that substitutional carbon is lost during integration, especially for highly N-type doped Si—C film. The reason for this loss is that when more than 1% substitutional C is placed in a silicon lattice, the carbon is in meta-stable state. Since using more than 1% substitutional C in the silicon lattice structure is generally preferred to have advantages, doping the source and drain regions with carbon is less than ideal. The problem with substitutional carbon migrating out becomes much worse when the transistor is exposed to high temperatures such as annealing temperatures. Since Si—C is meta-stable at higher temperatures, a transistor using Si—C might not survive the post thermal treatment required by device integration.

Another problem with using Si—C as the material for the source and drain of a transistor is that Si—C requires a reasonable high selective growth rate which is generally achieved by using higher processing temperatures. However, since carbon migrates at high temperatures because of the meta-stable substitutional C in the silicon lattice that contains Si—C, a transistor that is built using Si—C must be processed at low process temperatures of less than 600° C. Therefore, using Si—C presents problems because higher processing temperatures are desired to make better processes but the Si—C is unstable at the higher processing temperatures.

Therefore, what is needed is a system and method for creating a stress in the channel region of a transistor that is compatible with the high temperature annealing processes that the transistor undergoes during its manufacture.

BRIEF SUMMARY OF THE INVENTION

Embodiments of the invention relate to semiconductor devices that include a gate, and a source region and a drain region which are co-doped to produce a strain in the channel region of a transistor. The co-doping can include having a source and drain region having silicon and either boron and phosphorous or arsenic and gallium. The source and drain regions can include co-dopant levels of more than $10^{20}$ atom/$cm^3$. The source region and drain region each can be co-doped with more boron than phosphorous or can be co-doped with more phosphorous than boron, depending on whether device will be a PMOS or NMOS. Alternatively, the source region and drain region each can be co-doped with more arsenic than gallium or can be co-doped with more gallium than arsenic, depending on whether device will be a PMOS or NMOS.

Other embodiments of the invention relate to methods of manufacturing a semiconductor device that include forming a gate on top of a substrate and over a nitrogenated oxide layer, etching a portion of the substrate and nitrogenated oxide layer to form a recessed source region and a recessed drain region, filling the recessed source region and the recessed drain region with a co-doped silicon compound. The co-doped silicon compound can include silicon, boron and phosphorous or can include silicon, arsenic and gallium. The co-doped silicon compound can be epitaxially grown in the recesses.

BRIEF DESCRIPTION OF THE DRAWINGS

A further understanding of the nature and advantages of the invention may be realized by reference to the remaining portions of the specification and the drawings wherein like reference numerals are used throughout the several drawings to refer to similar components. In some instances, a sub label is associated with a reference numeral and follows a hyphen to denote one of multiple similar components. When reference is made to a reference numeral without specification to an existing sub label, it is intended to refer to all such multiple similar components. The Figures are incorporated into the detailed description portion of the invention.

DETAILED DESCRIPTION OF THE INVENTION

The present invention relates to the formation of strain-inducing materials on a substrate to improve the performance of transistors on a semiconductor device. In an embodiment, boron (B) and phosphorous (P) are introduced as a "stressor" to replace carbon. One advantage of replacing the tensile stress film Si—C with a film containing Si, B and P is that the resulting film does not contain carbon and therefore can be processed using higher process temperatures. In another embodiment, arsenic (As) and gallium (Ga) can be used in place of Ge.

Embodiments of the invention relate to semiconductor devices that include a gate, and a source region and a drain region which are co-doped to produce a strain in the channel region of a transistor. The co-doping can include having a source and drain region having silicon and either boron and phosphorous or arsenic and gallium. The source and drain regions can include co-dopant levels of more than $10^{20}$ atom/$cm^3$. The source region and drain region each can be co-doped with more boron than phosphorous or can be co-doped with more phosphorous than boron, depending on whether device will be a PMOS or NMOS. Alternatively, the source region and drain region each can be co-doped with more arsenic than gallium or can be co-doped with more gallium than arsenic, depending on whether device will be a PMOS or NMOS.

Other embodiments of the invention relate to methods of manufacturing a semiconductor device that include forming a gate on top of a substrate and over a nitrogenated oxide layer, etching a portion of the substrate and nitrogenated oxide layer to form a recessed source region and a recessed drain region, filling the recessed source region and the recessed drain region with a co-doped silicon compound. The co-doped silicon compound can include silicon, boron and phosphorous or can include silicon, arsenic and gallium. The co-doped silicon compound can be epitaxially grown in the recesses.

Figure 1:
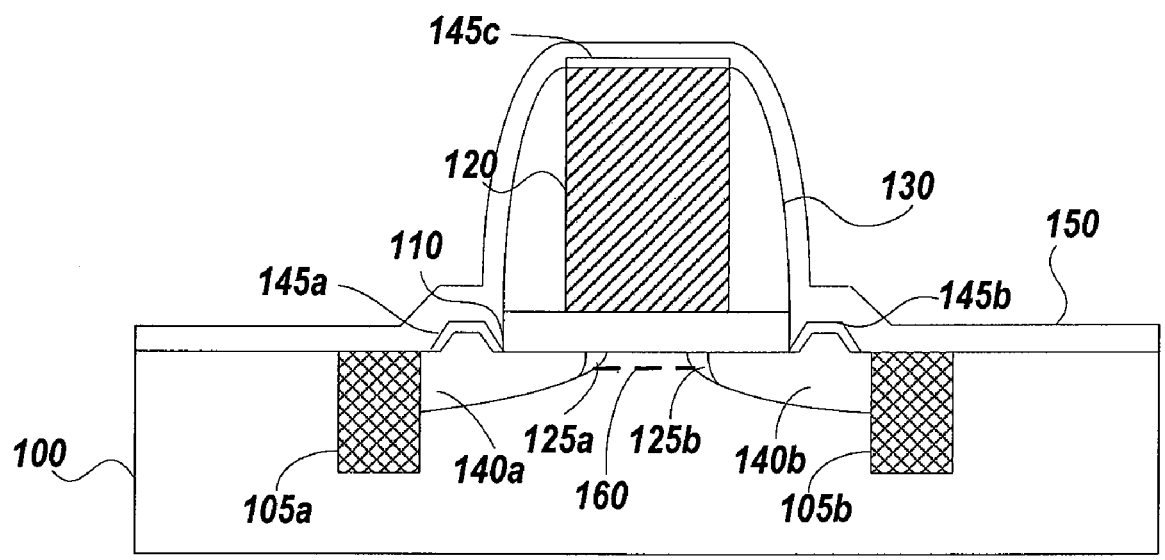
FIG. 1 illustrates a cross sectional view of an embodiment of a transistor having co-doped stress inducing material in the source and drain regions.

FIG. 1 illustrates a cross-sectional side view of an embodiment of a transistor having a stress-inducing material. The transistor 10 comprises a substrate 100, with two trenches 105a and 105b, a nitrogenated oxide layer 110, a gate 120, source/drain extension regions 125a and 125b, a spacer 130, source and drain regions 140a and 140b, nickel (Ni) layers 145a, 145b and 145c, an etch stop nitride layer 150 disposed over the entire structure, and a channel region 160. The substrate 100 comprises two trenches 105a and 105b which are used for shallow trench isolation. Shallow trench isolation is used to isolate the transistor 10 from other transistors built on substrate 100. Trenches 105a and 105b can have a side wall liner layer (not shown) formed within the trenches 105a and 105b by rapid thermal oxidation in an oxide/oxinitride atmosphere, which can round sharp corners on the trenches 105a and 105b. Trenches 105a and 105b can also include stressed layers and can be filled with materials having a tensile stress, such as a stressed silicon oxide material. Trenches 105a and 105b, which are filled with materials having tensile stress, can produce a stress to the channel region 160 and improve performance of transistor.

The nitrogenated oxide layer 110 and gate electrode 120 are provided on top of the channel region 160 between the source and drain regions 140a and 140b. The nitrogenated oxide layer 110 can have a thickness ranging from less than 10 Å to greater than 20 Å and a percentage of nitrogen within the oxide layer ranging between about 0% and about 20%. The gate electrode 120 is made of polysilicon and rests on top of the nitrogenated oxide layer 110. The source/drain extension regions 125a and 125b, which are shown adjacent to the source and drain regions 140a and 140b and the channel region 160, is constructed by ion implantation of germanium-carbon (Ge—C), germanium (Ge), germanium-iron (Ge—F), or iron (Fe). The spacer layer 130, which is shown on the sidewalls of the gate 120, is formed by a low-pressure chemical vapor deposition (LPCVD) process using chemistries that include Silane+Ammonia; DCS+Ammonia; BTBAS, high carbon; BTBAS, Low Carbon.

The source and drain regions 140a and 140b are formed by epitaxially growing the source and drain material in recesses that are etched into the substrate 100 to form the source and drain of the transistor. The source and drain material is also chosen to provide stress to the channel region 160. In an embodiment the source and drain materials is chosen to be silicon (S), boron (B) and phosphorous (P). In another embodiment, the source and drain materials is chosen to be silicon (S), arsenic (As) and gallium (Ga). B and P can be used to provide a tensile stress whereas As an Ga can be used to provide a compressive stress. Although the single dopant such as P or Ga is capable of producing the desired stresses on the channel, two dopants are used in these embodiments. In order for the dopants to provide an effect tensile stress or compressive stress, a significant amount of dopants needs to be incorporated into the source and drain regions. In some embodiments, dopant levels as high as $10^{20}$ atom/$cm^3$ to $10^{21}$ atom/$cm^3$ are used to provide sufficient tensile stress or compressive stress. In some optional embodiments, N-type and P-type co-doping may be performed so that the charge compensation effect of the two co-doping materials results in the desired net-dopant type while significantly increasing the dopant incorporation level and therefore increasing tensile stress or compressive stress. N-type and P-type co-doping result in net doping levels that are higher than the limits allowed when the films are doped with single dopant. The desired net doping type can be obtained by tailoring the relative concentration of the co-doping dopants. When the two dopants used provide similar types of stresses, co-doping provides strain more effectively than single dopant. For example, B and P can be used for tensile stress and As and Ga can be used for compress stress. In order to obtain the desired net-dopant type, the relative level of N-type and P-type can be controlled. For example, if more P than B is doped into the film, then a desired N-type tensile-stressed film can be obtain. Similarly, if more B than P is doped into the film, then a desired P-type tensile-stressed film can be obtain Additionally, B and P are thermally more stable than carbon in a silicon lattice. Therefore, a higher process temperature is possible when B and P is used as a dopant instead of C. This higher processing temperature results in a film that can sustain a higher thermal budget for easier integration. Co-doping can be achieved by epitaxial growth or co-implant and anneal.

The source and drain regions 140a and 140b and the gate 120 are covered with nickel (Ni) layers 145a, 145b and 145c. An etch stop nitride layer 150 is disposed over the entire structure. The channel region 160 can include doped silicon, such as for example silicon comprising n or p-type dopants. Alternatively the channel region 160 can include a material other than doped silicon, such as for example germanium. When sufficient voltage is applied across the gate 120, charge conducts from the source region to the drain region through the channel region 160.

FIGS. 2A-2J show schematic illustrations of fabrication techniques used to manufacture of a transistor in a semiconductor device having stressed silicon germanium as a source/drain in accordance with one embodiment of the invention. Boron (B) and phosphorous (P) are doped into the source/drain region to create a stress instead of carbon. Similarly, arsenic (As) and gallium (Ga) can be used in place of Ge to cause the stress. With the current embodiment the tensile stress film Si—C, used in the prior art, can be replaced because it is carbon less therefore allows for higher process temperature and thermal budgets.

Figure 2A:
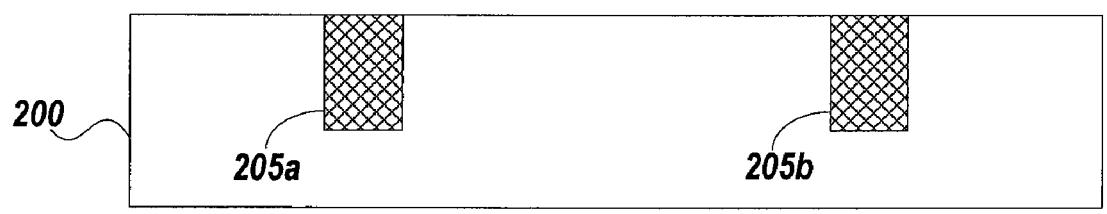
FIG. 2A illustrates a substrate having two trenches filled with dielectric used to build a semiconductor device including a transistor with stress inducing material.

FIG. 2A illustrates a substrate 200 used to build the semiconductor device. Substrate 200 includes two trenches 205a and 205b filled with a dielectric. The trenches 205a and 205b are used to separate semiconductor devices built between the trenches. The substrate 200 is a silicon substrate and the trench 205a and 205b are formed by etching into the substrate and filling them with a dielectric. The trenches 205a and 205b are used to isolate adjacent semiconductor devices which are constructed within the trenches as described below with reference to FIGS. 2B-2J.

Figure 2B:
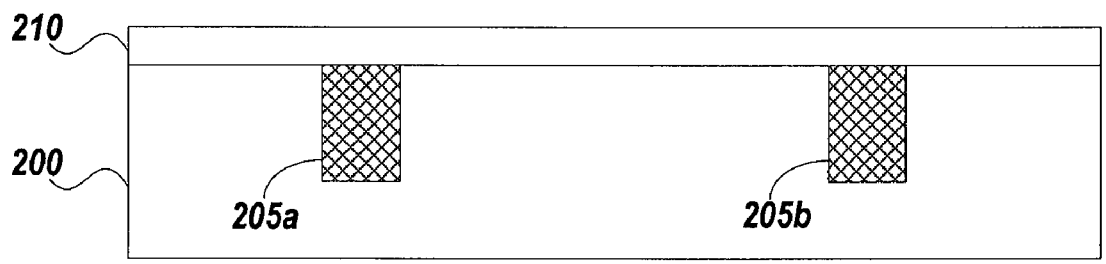
FIGS. 2B-2D illustrate the various stages of the gate forming process of the transistor with stress inducing material.
Figure 2C:
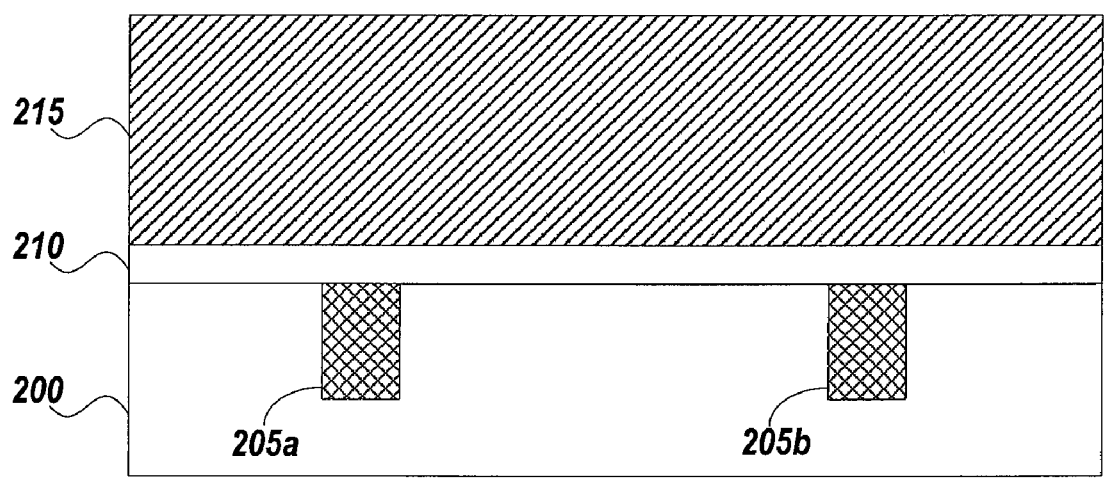
Figure 2D:
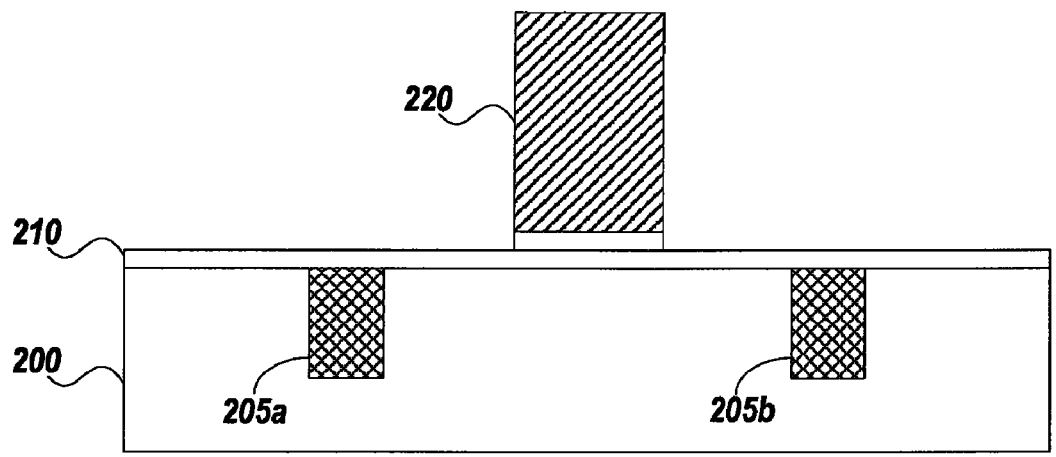

FIGS. 2B-2D show schematic illustrations of fabrication techniques used to form the gate of a transistor having stress inducing material.

FIG. 2B illustrates a substrate 200 with a nitrogenated oxide layer 210 deposited on top of the substrate covering both the substrate surface and both trenches 205a and 205b. The nitrogenated oxide layer 210 is formed by first depositing an oxide layer on the surface and then bombarding the oxide layer with nitrogen. In one embodiment the oxide layer, which is grown on top of the surface of the substrate, has a thickness ranging from less than 10 Å to greater than 20 Å. The oxide layer can be grown using the Applied Materials Centura™ Gate Stack tool. The oxide layer is then is then exposed to nitrogen so that the percentage of nitrogen within the oxide layer ranges between about 0% and about 20%. The nitradation of the oxide layer can also be done with an Applied Materials Centura™ Gate Stack tool. The resulting nitrogenated oxide layer 210 has a thickness that is less than 20 Å and a nitrogen content that ranges between about 0% and about 20%

FIG. 2C illustrates the substrate 200 with a nitrogenated oxide layer 210 and a polysilicon layer 215 deposited on it. This polysilicon layer 215, which will eventually be the gate of the semiconductor device, can be amorphous, columnar, microcrystalline grain, or hemispherical grain. The polysilicon layer 215 can be deposited using the Applied Materials Centura™ Gate Stack tool.

FIG. 2D illustrates the substrate 200, the nitrogenated oxide layer 210 and the polysilicon layer 215, as shown in FIG. 2C, after an etching process. The etching process creates the gate 220 by etching away the polysilicon according to a predetermined pattern that is governed by a mask that is placed over the polysilicon layer 215 before etching. The etching process can be footed, straight, notched or hour glass. The etch process etches the polysilicon layer 215 as well as a portion of the nitrogenated oxide layer 210. Although all of the polysilicon layer 215, except for the portion that will be the gate 220, is etched, only some of the nitrogenated oxide layer 210 is etched. The amount of the nitrogenated oxide layer 210 that is etched can depend on the process including how quickly an end point detector can detect that the nitrogenated oxide layer 210 is being etched and send a signal to a controller to stop the etching process. The etch process, which creates the gate 220, can be done with Applied Materials Centura™ Gate Etch tool and the Applied Materials Producer™ APF PECVD Etch tool. After the etch process is complete, a reoxidation process is done to deposit a nitrogenated oxide layer 210 back onto the nitrogenated oxide layer 210 so that the resulting thickness is about the same thickness as it was prior to the etch process. The reoxidation process can be done with an Applied Materials Vantage™ RadOx Tool.

Figure 2E:
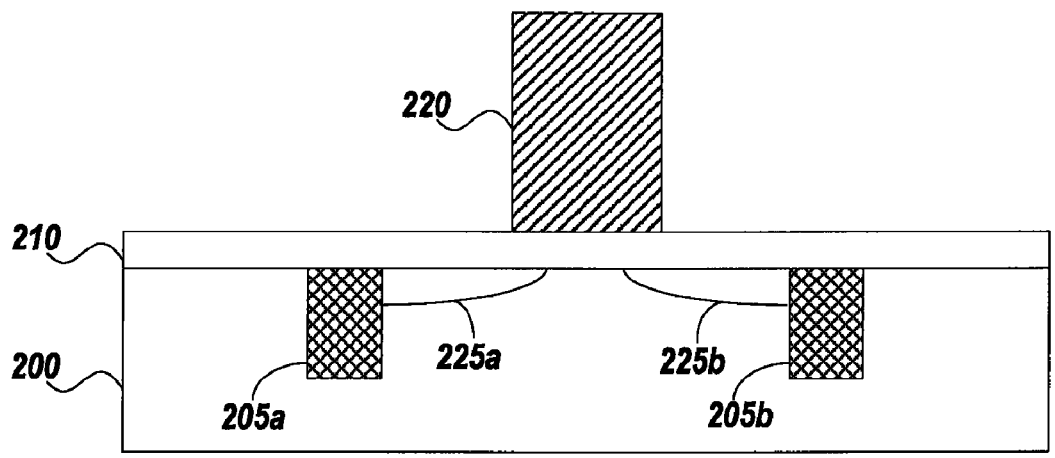
FIGS. 2E-2F illustrate the various stages of the junction formation process of the transistor with stress inducing material.
Figure 2F:
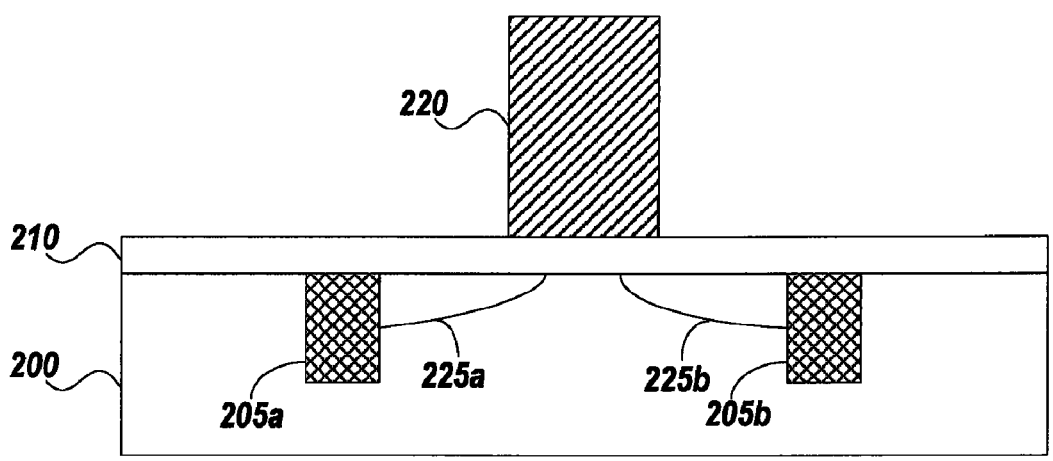

FIGS. 2E-2F show schematic illustrations of fabrication techniques used to form the junction of a transistor having stress inducing material.

FIG. 2E illustrates the substrate 200 with the two trenches 205a and 205b, the nitrogenated oxide layer 210 the gate 220 and a pair of source/drain extension implants 225a and 225b. The source/drain extension implants 225a and 225b can be formed by implanting boron for a PMOS and phosphorous for an NMOS device. The energy set for PMOS boron can range from 1 KeV to greater than 10 KeV. Similar ranges can be used for NMOS phosphorous. The implant process, which is used to make the source/drain extension implants 225a and 225b, can be performed with an Applied Materials Quantum™ X Implant tool. The implant process can include implanting materials having germanium-carbon (Ge—C), germanium (Ge), germanium-iron (Ge—F), or iron (Fe).

FIG. 2F illustrates the substrate 200 with the two trenches 205a and 205b, the nitrogenated oxide layer 210 the gate 220 and the source/drain extension implants 225a and 225b after annealing and activation. The annealing and activation causes the implanted atoms to diffuse, which makes the source and drain regions larger. Some examples of annealing and activation include raising the temperature to 950° C. at 150° C./sec, or raising the temperature to 1050° C. at 150° C./sec, or raising the temperature to 1050° C. at 250° C./sec, or raising the temperature to 1100° C. at 250° C./sec. The dwell time at the high temperatures can vary from zero seconds to minutes. The annealing and activation process used to make the source/drain implants 225a and 225b can be performed with an Applied Materials Vantage™ Radiance Plus Rapid Thermal Process (RTP).

Figure 2G:
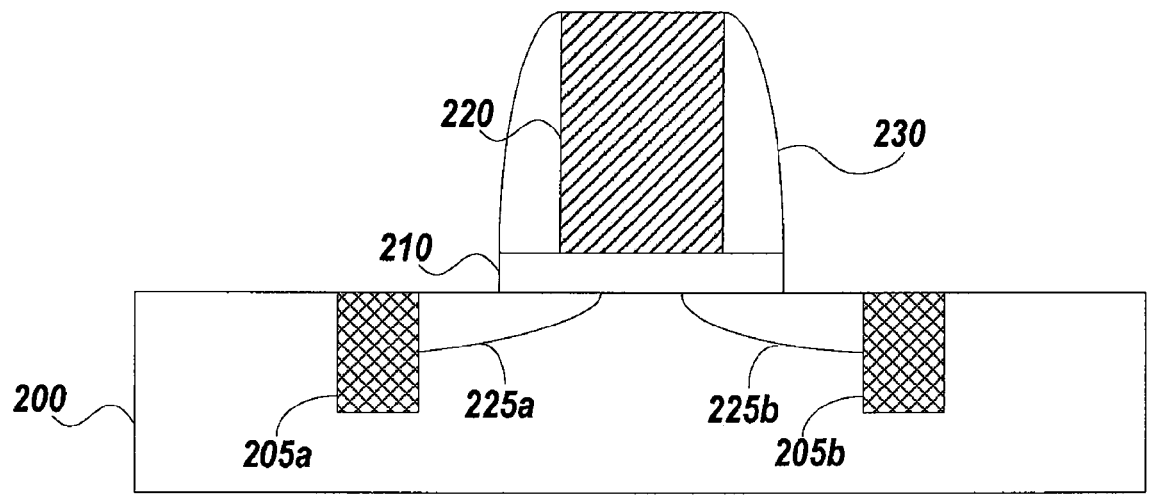
FIG. 2G illustrates the formation of a spacer of the transistor with stress inducing material.

FIG. 2G illustrates the substrate 200 with the two trenches 205a and 205b, the nitrogenated oxide layer 210 the gate 220, the source/drain implants 225a and 225b and a spacer 230. The spacer 230 is formed by depositing the spacer material over the entire device and then etching away the spacer material and a portion of the nitrogenated oxide layer 210. Since the spacer material adheres to the polysilicon gate 220 better than to the nitrogenated oxide layer 210, the etching process leaves behind a portion of the spacer 230 on the sidewalls of the gate 220. An LPCVD process is used for spacer deposition. Some examples of LPCVD process chemistry includes Silane+Ammonia; DCS+Ammonia; BTBAS, high carbon; BTBAS, Low Carbon. The spacer can be formed with an Applied Materials Centura™ SiNgen plus LPCVD Tool.

Figure 2H:
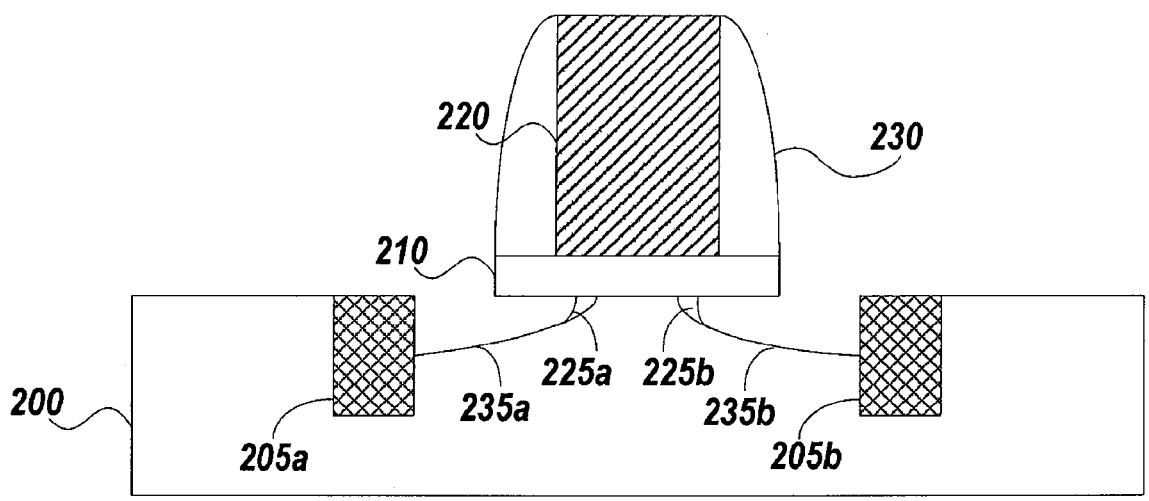
FIG. 2H-2J illustrate the various stages making a stress in the channel region of the transistor.
Figure 2I:
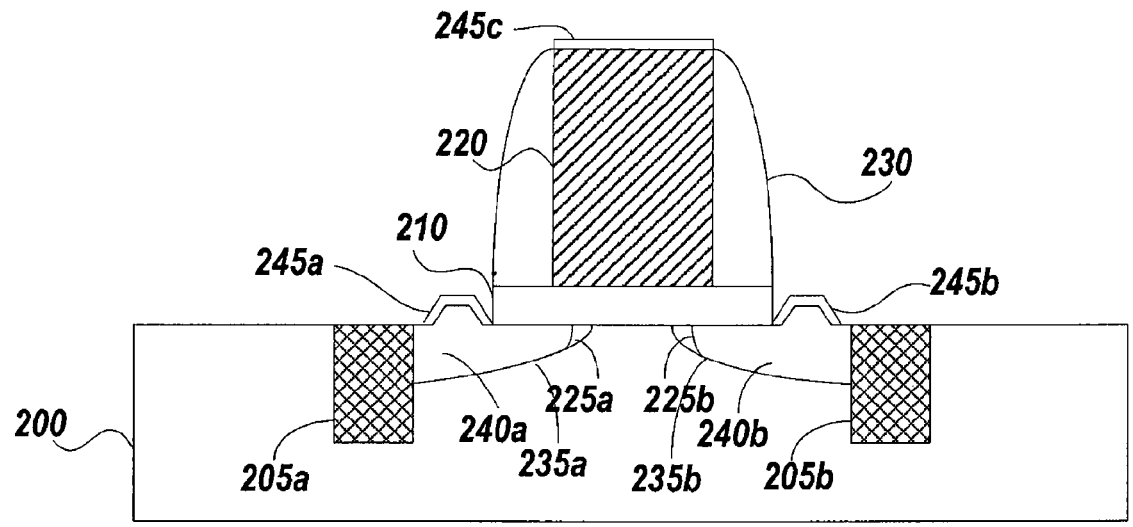
Figure 2J:
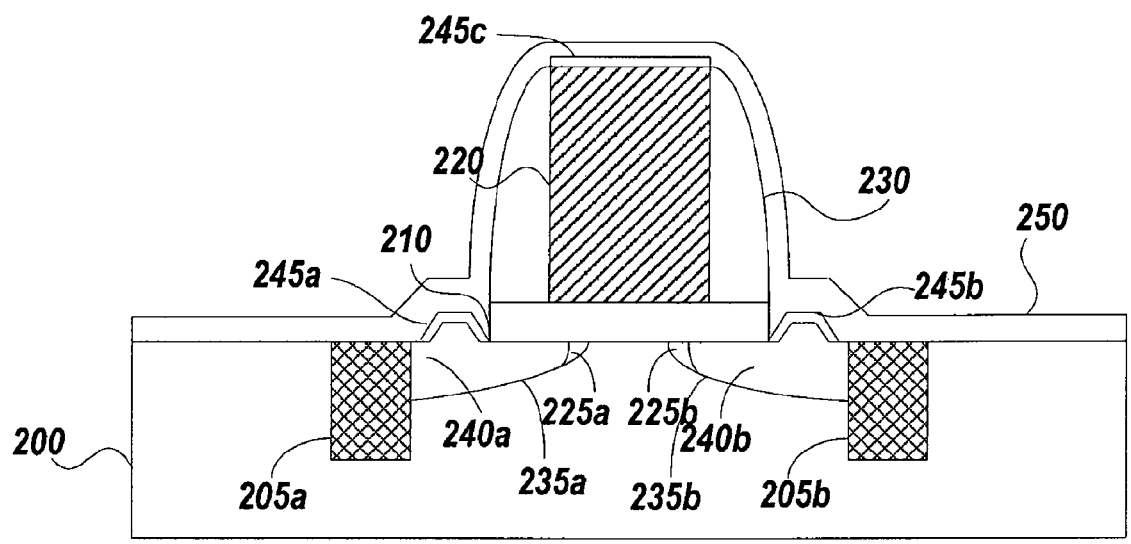

FIGS. 2H-2J show schematic illustrations of fabrication techniques used to apply strain to the transistor in a semiconductor device and improve the electrical properties of the device.

FIG. 2H illustrates the substrate 200 with the two trenches 205a and 205b, the nitrogenated oxide layer 210, the gate 220, the source/drain implants 225a and 225b, the spacer 230, and recesses 235a and 235b formed in the substrate to make the source and drain. Recesses 235a and 235b are formed by etching the silicon substrate 200 in the area where the source/drain extension implants 225a and 225b are located and partially under the remaining nitrogenated oxide layer 210. The etching process removes from less than 100 Å to about 1000 Å of substrate 200. Recesses 235a and 235b can be formed with an Applied Materials Centura DPS™ Silicon Etch Tool. The etching process also leaves behind a small amount of the source/drain extension implants 225a and 225b, which can become the source/drain extensions of the transistor.

FIG. 2I illustrates the substrate 200 with the two trenches 205a and 205b, the nitrogenated oxide layer 210, the gate 220, the source/drain extension implants 225a and 225b, the spacer 230, and recesses 235a and 235b filled with a source/drain material 240a and 240b and a nickel layer 245a, 245b, and 245c covering the source/drain material 240a and 240b as well as the gate 220. The source/drain material 240a and 240b is epitaxially grown in recesses 235a and 235b to form the source and drain of the semiconductor device as well as provide stress to the channel region. In an embodiment, the source and drain materials is chosen to be silicon (S), boron (B) and phosphorous (P). In another embodiment the source and drain materials is chosen to be silicon (S), arsenic (As) and gallium (Ga). B and P can be used to provide a tensile stress whereas As an Ga can be used to provide a compressive stress. Although a single dopant such as P or Ga is capable of producing the desired stresses on the channel, two dopants are used in these embodiments.

In order for the dopant to provide an effect tensile stress or compressive stress, a significant amount of dopant should be incorporated into the source and drain regions. In some embodiments, dopant levels as high as $10^{20}$ atom/cm$^3$ to $10^{21}$ atom/cm$^3$ are used to provide sufficient tensile stress or compressive stress. In some optional embodiments, N-type and P-type co-doping may be performed so that the charge compensation effect of the two co-doping materials results in the desired net-dopant type while significantly increasing the dopant incorporation level and therefore increasing tensile stress or compressive stress. N-type and P-type co-doping result in net doping levels that are higher than the limits allowed when the films are doped with a single dopant. The desired net doping type can be obtained by tailoring the relative concentration of the co-doping dopants. When the two dopants used in the co-doping process provide the same type of stresses on the channel region, co-doping provides strain more effectively than single dopant. For example, B and P can be used for tensile stress and As and Ga can be used for compress stress. In order to obtain the desired net-dopant type, the relative level of N-type and P-type can be controlled. For example, if more P than B is doped into the film, then a desired N-type tensile-stressed film can be obtained. Similarly, if more B than P is doped into the film, then a desired P-type tensile-stressed film can be obtained.

In embodiments, the dopants can be incorporated into the source and drain regions using an epitaxial growth (epi) process operating at temperatures ranging from 500° C. to 850° C. and at pressures ranging from 5 torr to 100 torr. In some embodiments the epi processes is maintained at temperatures ranging from 650° C. to 800° C., or at temperatures ranging form 700° C. to 750° C., depending on the application. Similarly, in some embodiments the processing pressure ranges from 10 torr to 30 torr.

The precursuor gas used in the epi process can be $SiH_4$, $Si_2H_6$, $SiH_2Cl_2$ or mixtures thereof. Those skilled in the art will realize that other silicon precursors can also be used in the epi process. During the epi deposition process, a precursor gas such as $SiH_4$, is supplied to the epi chamber at a flow ranging from 1 sccm to 500 sccm with a preferred flow rate of about 200 sccm. If $Si_2H_6$ is used as a precursor gas, the $Si_2H_6$ gas is flowed into the epi processing chamber at a flow rate ranging from 0.5 sccm to 100 sccm with a preferred flow rate of about 20 sccm. Carrier gases, such as $H_2$ or $N_2$, can also be used during the epi deposition process by flowing them into the chamber at a rate ranging from 0.5 slm to 50 slm, with 5 slm to 10 slm being the preferred flow rate in some embodiments. Co-doping is performed by flowing between 0.1 sccm and 10 sccm of dopants such as diborane and phosophine into the epi chamber. In some embodiments between about 2 sccm and 3 sccm of dopants are flowed into the chamber.

For selective processes, HCl is flowed into the epi processing chamber. Other selective processes can include flowing a hydrohalide including HCl, HBr, HI or mixtures thereof into the epi processing chamber. The flow rate will vary depending on the silicon source used. For example, if silane is used, the flow rate is about 100 sccm but can range from 10 sccm to 500 sccm, whereas if disilane is used, the flow rate is about 750 sccm but can range from 100 sccm to 20000 sccm. For selective processes performed at about 750° C., 30 Å/min to 50 Å/min of growth rate would be expected, which results in about 300 Å to 500 Å of growth in about 10 minutes.

The source/drain material 240a and 240b can be epitaxial grown using an Applied Materials Centura™ RP Epi Tool. The nickel (Ni) layer 245a and 245b, which has a thickness ranging from 50-300 Å, can be deposited using an Applied Materials Endura™ Alps Ni PVD Tool.

FIG. 2J illustrates the substrate 200 with the two trenches 205a and 205b, the nitrogenated oxide layer 210, the gate 220, the source/drain extension implants 225a and 225b, the spacer 230, recesses 235a and 235b filled with co-doping stress inducing material 240a and 240b, Ni layers 245a, 245b and 245c, and an etch stop nitride layer 250 disposed over the entire structure. The Etch stop nitride layer 250 can be deposited over the entire structure using an Applied Materials Producer™ Nitride PECVD Tool. The etch stop nitride layer 250 causes a stress which improves the electrical properties of the semiconductor device. For example, the etch stop nitride layer 250 can be chosen to have a film stress with tensile+1.4 GPa, neutral 0 GPa, compressive −1.2 GPa, or compressive −2.4 GPa.

Figure 3:
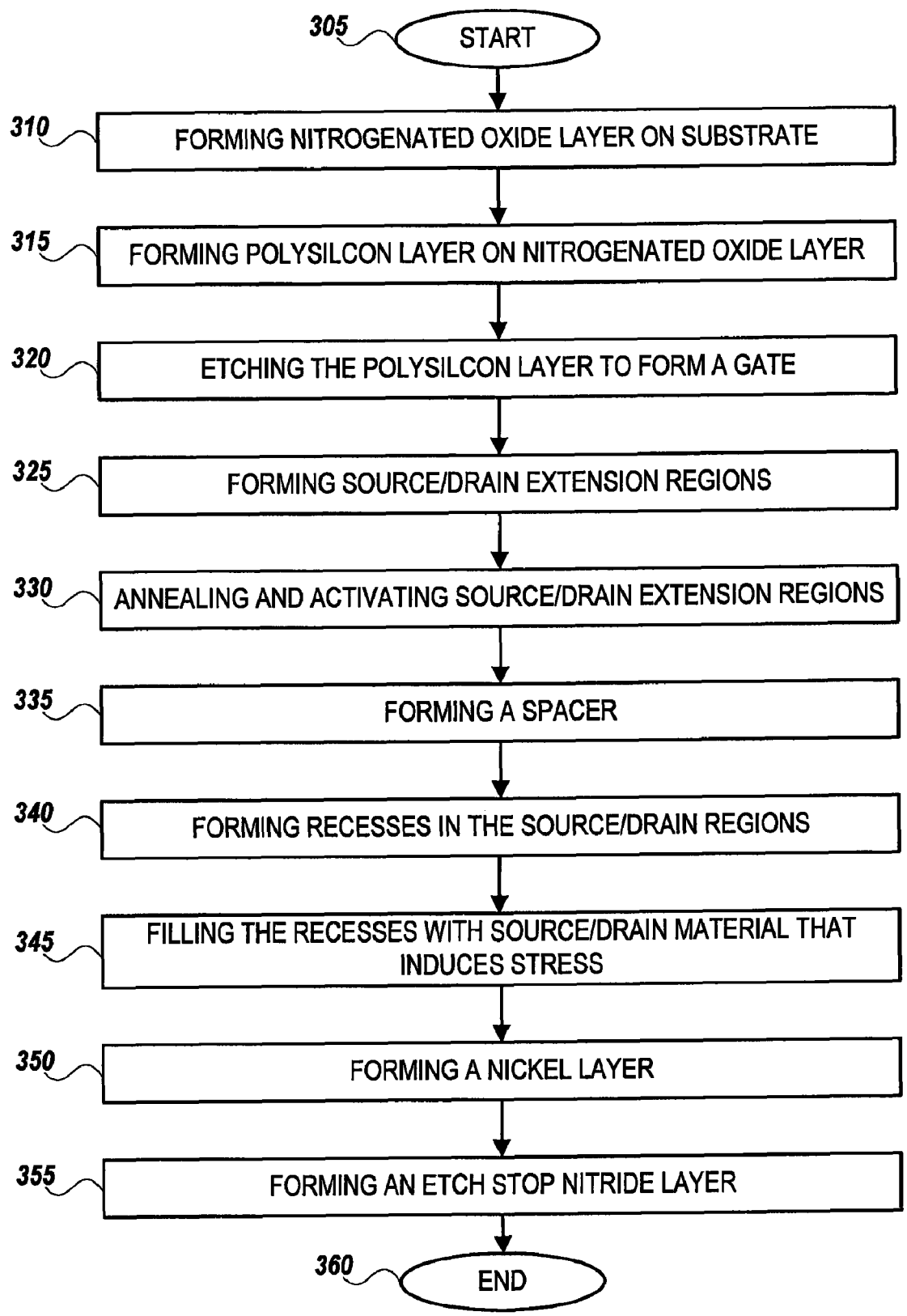
FIG. 3 is a flow chart illustrating an embodiment of a method of forming the transistor with stress inducing material.

FIG. 3 is a flow chart illustrating a general method of forming a semiconductor device having the stress inducing material grown in the source and drain regions 140a and 140b. The method starts in operation 305 where a substrate with dielectric filled trenches is provided for constructing the semiconductor device. Next in operation 310, a nitrogenated oxide layer is formed on the substrate. The nitrogenated oxide layer gate is formed by first depositing an oxide layer and then exposing the oxide layer to nitrogen. The oxide layer can be deposited directly over the substrate or there can be an intermediate layer deposited between the substrate and the oxide layer. In operation 315, a polysilicon layer is deposited onto the nitrogenated oxide layer. Next in operation 320, the gate structure is formed by etching the polysilicon layer.

After the gate structure is formed in operation 320, the transistor junction is formed. In operation 325, the source/drain extension regions are formed by implanting Ge—C, Ge, Ge—F, Fe into the substrate in regions near the gate structures. Next, in operation 330, the source/drain extension regions are annealed and activated by subjecting the structure to rapid thermal processing. After the junction is formed in operation 330, a spacer is formed in operation 335 by depositing a spacer material over the entire structure and then etching away the spacer material and a portion of the nitrogenated oxide layer. Since the spacer adheres better to the polysilicon material then to other materials, the etching process removes all of the spacer material except some material that is left on the sidewalls of the polysilicon gate.

Next in operation 340, recesses are formed in the source and drain regions by an etching process. In operation 345, the recesses are then filled with a source/drain material to form the source and the drain of the transistor. The source and drain material is also chosen to both serve as a drain source as well as provide stress to the channel region. In an embodiment, the source and drain materials is chosen to be silicon (S), boron (B) and phosphorous (P). In another embodiment, the source and drain materials is chosen to be silicon (S), arsenic (As) and gallium (Ga). B and P can be used to provide a tensile stress whereas As an Ga can be used to provide a compressive stress. Although a single dopant such as P or Ga is capable of producing the desired stresses on the channel, two dopants are used in these embodiments. In order for the dopants to provide an effect tensile stress or compressive stress, a significant amount of dopant is incorporated into the source and drain regions. In some embodiments, dopant levels as high as $10^{20}$ atom/cm$^3$ to $10^{21}$ atom/cm$^3$ are used to provide sufficient tensile stress or compressive stress. In some optional embodiments, N-type and P-type co-doping may be performed so that the charge compensation effect of the two co-doping materials results in the desired net-dopant type while significantly increasing the dopant incorporation level and therefore increasing tensile stress or compressive stress. N-type and P-type co-doping result in net doping levels that are higher than the limits allowed when the films are doped with a single dopant. The desired net doping type can be obtained by tailoring the relative concentration of the co-doping dopants. When the two dopants provide same type of stresses, co-doping provides strain more effectively than single dopant. For example, B and P can be used for tensile stress and As and Ga can be used for compress stress. In order to obtain the target net-dopant type, the relative level of N-type and P-type can be controlled. For example, if more P than B is doped into the film, then a desired N-type tensile-stressed film can be obtained. Similarly, if more B than P is doped into the film, then a desired P-type tensile-stressed film can be obtained.

In operation 340, the dopants can be introduced into the source and drain regions using an epitaxial growth (epi) process running at temperatures ranging from 500° C. to 850° C. and at pressures ranging from 5 torr to 100 torr. In some embodiments the epi processes is maintained at temperatures ranging from 650° C. to 800° C., or at temperatures ranging form 700° C. to 750° C., depending on the application. Similarly, in some embodiments the processing pressure ranges from 10 torr to 30 torr.

The precursuor gas used in the epi process of operation 340 can be $SiH_4$, $Si_2H_6$, $SiH_2Cl_2$ or mixtures thereof. Those skilled in the art will realize that other silicon precursors can also be used in the epi process. During the epi deposition process, a precursor gas such as $SiH_4$, is supplied to the epi chamber at a flow ranging from 1 sccm to 500 sccm with a preferred flow rate of about 200 sccm. If $Si_2H_6$ is used as a precursor gas, the $Si_2H_6$ gas is flowed into the epi processing chamber at a flow rate ranging from 0.5 sccm to 100 sccm with a preferred flow rate of about 20 sccm. Carrier gases, such as $H_2$ or $N_2$, can also be used during the epi deposition process by flowing them into the chamber at a rate ranging from 0.5 slm to 50 slm, with 5 slm to 10 slm being the preferred flow rate in some embodiments. Co-doping, is performed by flowing between 0.1 sccm and 10 sccm of dopants such as diborane and phosophine into the epi chamber. In some embodiments between about 2 sccm and 3 sccm of dopants are flowed into the chamber.

For selective processes, HCl is flowed into the epi processing chamber. Other selective processes can include flowing a hydrohalide including HCl, HBr, HI or mixtures thereof into the epi processing chamber. The flow rate will vary depending on the silicon source used. For example, if silane is used, the flow rate is about 100 sccm but can range from 10 sccm to 500 sccm, whereas if disilane is used, the flow rate is about 750 sccm but can range from 100 sccm to 20000 sccm. For selective processes performed at about 750° C., 30 Å/min to 50 Å/min of growth rate would be expected, which results in about 300 Å to 500 Å of growth in about 10 minutes.

In operation 350, a nickel layer is formed over the source, drain and gate regions. In this operation, the nickel layer is deposited over the entire structure and then etched off leaving behind nickel caps over the source, drain and gate regions. Next in operation 355, as an etch stop layer if formed over the entire structure. The etch stop layer can provide additional stress to the channel region. The method ends in operation 360 when the substrate is prepared for slicing into sections with transistors in them.

Figure 4:
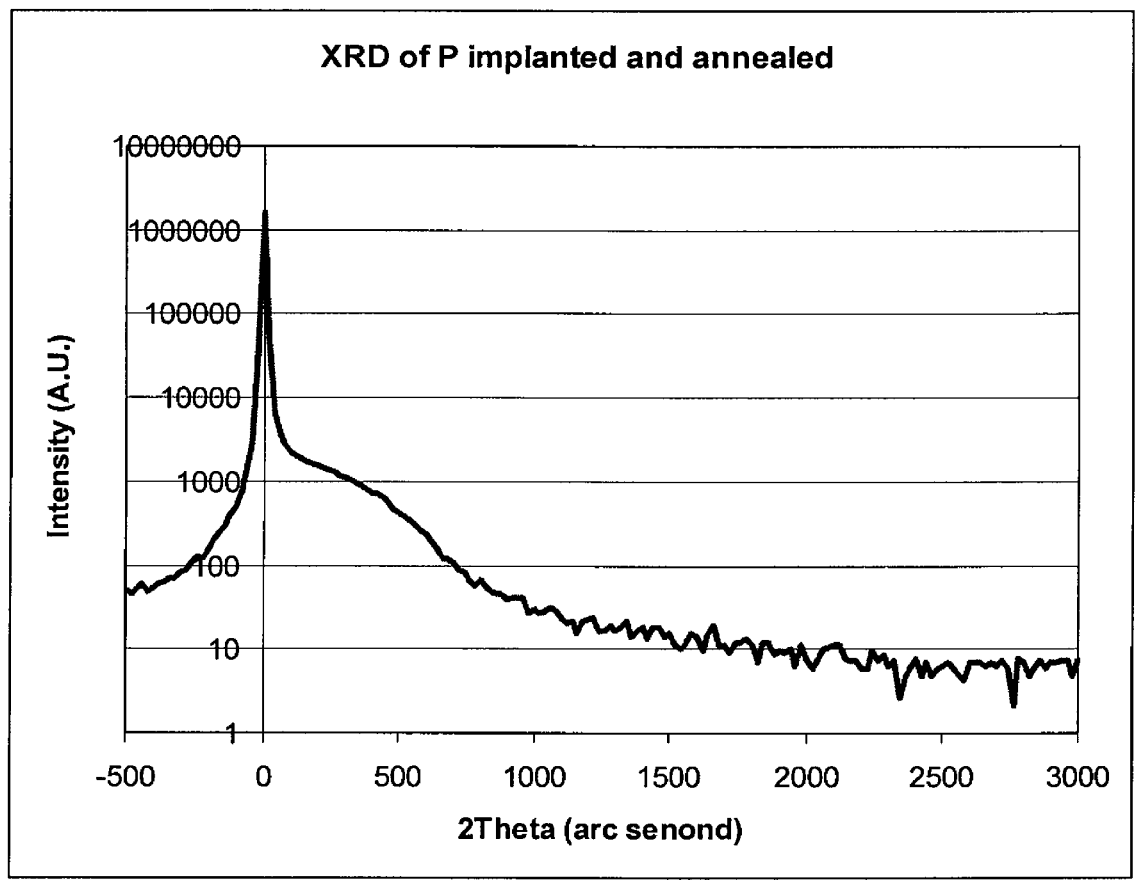
FIG. 4 is a plot showing intensity vs. 2 theta for XRD data of a heavily phosphorus (P) implanted silicon (Si) substrate after annealing.

FIG. 4 is a plot showing intensity vs. 2 theta for XRD data of a heavily P implanted Si substrate after annealing. The XRD intensity data as a function of 2 theta shows a shoulder around 400 arc seconds, which indicates a tensile stress induced by the implanted phosphorus. The XRD intensity data was taking on a substrate that was implanted with P atoms using an energy of 4 Kev and a dosage of $10^{15}$ atoms/$cm^2$ dose. The implantation process was performed using an Applied Materials Quantum™ X Implant tool. The resulting implanted substrate contained about $5\sim10\times10^{20}$ atoms/$cm^3$ dopant concentration. The implanted substrate was annealed using a spike anneal at 1050° C.

Figure 5:
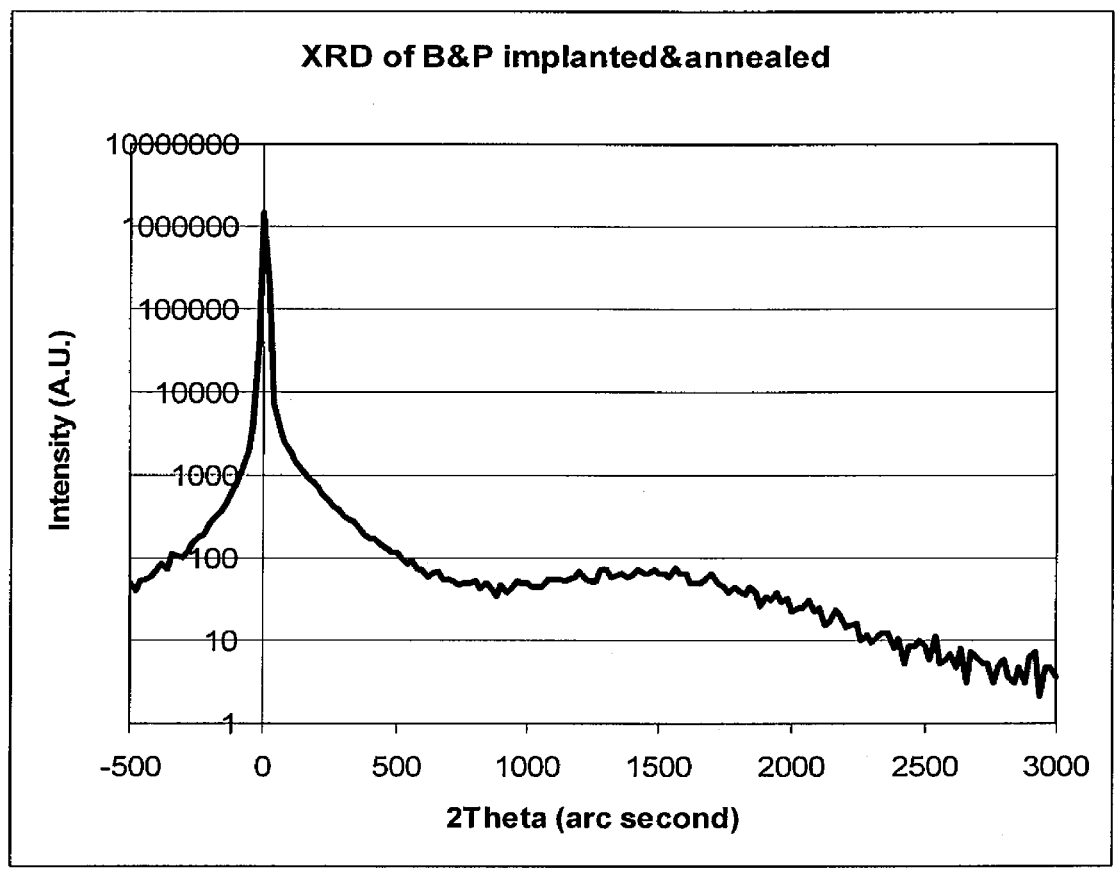
FIG. 5 is a plot showing intensity vs. 2 theta for XRD data of a heavily boron (B) and phosphorous (P) implanted silicon (Si) substrate after annealing.

FIG. 5 is a plot showing intensity vs. 2 theta for XRD data of a heavily B and P implanted Si substrate after annealing. The XRD intensity data as a function of 2 theta shows a shoulder around 1500 arc seconds, which indicates a tensile stress induced by the implanted phosphorus and boron. The tensile stress is equivalent to 1.5% of substitutional carbon. The XRD intensity data was taking on a substrate that was implanted with B and P atoms using an energy of 4 Kev and a dosage of $10^{15}$ atoms/$cm^2$ dose. The implantation process was performed using an Applied Materials Quantum™ X Implant tool. The resulting implanted substrate contained about $5\sim10\times10^{20}$ atoms/$cm^3$ dopant concentration. The implanted substrate was annealed using a spike anneal at 1050° C.

In an embodiment, a semiconductor device includes a gate, a source region including boron and phosphorous, and a drain region including boron and phosphorous. The source and drain regions can include dopant levels of boron and phosphorous that are more than $10^{20}$ atom/$cm^3$. The source region and drain region each can include more boron than phosphorous. Alternatively, the source region and drain region each can include more phosphorous than boron.

In another embodiment, a semiconductor device includes a gate, a source region including arsenic and gallium, and a drain region including arsenic and gallium. The source and drain regions can include dopant levels of arsenic and gallium that are more than $10^{20}$ atom/$cm^3$. The source region and drain region each can include more arsenic than gallium. Alternatively, the source region and drain region each can include more gallium than arsenic.

In yet another embodiment, a method of manufacturing a semiconductor device, includes forming a gate on top of a substrate and over a nitrogenated oxide layer, etching a portion of the substrate and nitrogenated oxide layer to form a recessed source region and a recessed drain region, filling the recessed source region and the recessed drain region with a compound including of silicon, boron and phosphorous. An etch stop layer can also be deposited for providing additional stress to a channel region in the semiconductor device. The recessed source region and the recessed drain region can be filled using epitaxial deposition. Additionally, the recessed source region and the recessed drain region can be filled with a compound having dopant levels of boron and phosphorous greater than $10^{20}$ atom/$cm^3$. The recessed source region and the recessed drain region can also be filled with a compound that can include more phosphorous than boron. Alternatively, the recessed source region and the recessed drain region can also be filled with a compound that can include more boron than phosphorous. The method can further include forming a nickel layer on the gate, the drain region and the source region. The method can further include annealing the semiconductor device.

In yet another embodiment, a method of manufacturing a semiconductor device includes forming a gate on top of a substrate and over a nitrogenated oxide layer, etching a portion of the substrate and nitrogenated oxide layer to form a recessed source region and a recessed drain region, and filling the recessed source region and the recessed drain region with a compound including silicon, arsenic and gallium. An etch stop layer can also be deposited for providing additional stress to a channel region in the semiconductor device. The recessed source region and the recessed drain region can be filled using epitaxial deposition. Additionally, the recessed source region and the recessed drain region can be filled with a compound having dopant levels of arsenic and gallium that are greater than $10^{20}$ atom/cm$^3$. The recessed source region and the recessed drain region can also be filled with a compound that can include more arsenic than gallium. Alternatively, the recessed source region and the recessed drain region can also be filled with a compound that can include more gallium than arsenic. The method can further include forming a nickel layer on the gate, the drain region and the source region. The method can further include annealing the semiconductor device.

In yet another embodiment, a method of manufacturing a semiconductor device, includes forming a gate, forming a source region by implanting boron and phosphorous into first silicon region, forming a drain region by implanting boron and phosphorous into a second silicon region, and annealing the semiconductor device. The source region can be formed by implanting boron and phosphorous using a voltage ranging from 1 KeV to 20 KeV and a dosage ranging from $10^{14}$ to $10^{16}$ atoms/cm$^2$. The drain region can be formed by implanting boron and phosphorous using a voltage ranging from 1 KeV to 20 KeV and a dosage ranging from $10^{14}$ to $10^{16}$ atoms/cm$^2$. The annealing can be done at 1050° C. In embodiments such as a process for making a CMOS, the source and drain are formed together.

It will also be recognized by those skilled in the art that, while the invention has been described above in terms of preferred embodiments, it is not limited thereto. Various features and aspects of the above-described invention may be used individually or jointly. Further, although the invention has been described in the context of its implementation in a particular environment and for particular applications, those skilled in the art will recognize that its usefulness is not limited thereto and that the present invention can be utilized in any number of environments and implementations.

What is claimed is:

1. A semiconductor device on a silicon substrate comprising:
   a gate electrode;
   an oxide layer having an upper surface adjacent to the gate electrode;
   a source region comprising boron and phosphorous at a dopant level of more than $10^{20}$ atom/cm$^3$, a portion of an upper surface of the source region being adjacent to a lower surface of the oxide layer and at least a portion of a lower surface of the source region being adjacent to the silicon substrate, the source region being substantially free of carbon;
   a source extension region disposed adjacent to the source region, the source extension region comprising at least one of germanium (Ge), carbon (C), or iron (Fe), an upper surface of the source extension region being adjacent to the lower surface of the oxide layer, the source region and the source extension region being separated from the gate electrode by the oxide layer;
   a drain region comprising boron and phosphorous at a dopant level of more than $10^{20}$ atom/cm$^3$, a portion of an upper surface of the drain region being adjacent to the lower surface of the oxide layer and at least a portion of a lower surface of the drain region being adjacent to the silicon substrate, the drain region being substantially free of carbon;
   a drain extension region disposed adjacent to the drain region, the drain extension region comprising at least one of germanium (Ge), carbon (C), or iron (Fe), an upper surface of the drain extension region being adjacent to the lower surface of the oxide layer, the drain region and the drain extension region being separated from the gate electrode by the oxide layer; and
   a channel region disposed between the source extension region and the drain extension region and separated from the gate electrode by the oxide layer, the source extension region extending between the channel region and the source region and the drain extension region extending between the channel region and the drain region, wherein the channel region is stressed by the source region and the drain region.

2. The semiconductor device of claim 1 wherein the source region and the drain region each comprise more boron than phosphorous.

3. The semiconductor device of claim 1 wherein the source region and the drain region each comprise more phosphorous than boron.

4. A semiconductor device on a silicon substrate comprising:
   a gate electrode;
   an oxide layer having an upper surface adjacent to the gate electrode;
   a source region comprising arsenic and gallium at a dopant level of more than $10^{20}$ atom/cm$^3$, a portion of an upper surface of the source region being adjacent to a lower surface of the oxide layer and at least a portion of a lower surface of the source region being adjacent to the silicon substrate, the source region being substantially free of germanium;
   a source extension region disposed adjacent to the source region, the source extension region comprising at least one of germanium (Ge), carbon (C), or iron (Fe), an upper surface of the source extension region being adjacent to the lower surface of the oxide layer, the source region and the source extension region being separated from the gate electrode by the oxide layer;
   a drain region comprising arsenic and gallium at a dopant level of more than $10^{20}$ atom/cm$^3$, a portion of an upper surface of the drain region being adjacent to the lower surface of the oxide layer and at least a portion of a lower surface of the drain region being adjacent to the silicon substrate, the drain region being substantially free of germanium;
   a drain extension region disposed adjacent to the drain region, the drain extension region comprising at least one of germanium (Ge), carbon (C), or iron (Fe), an upper surface of the drain extension region being adjacent to the lower surface of the oxide layer, the drain region and the drain extension region being separated from the gate electrode by the oxide layer; and
   a channel region disposed between the source extension region and the drain extension region and separated from the gate electrode by the oxide layer, the source extension region extending between the channel region and the source region and the drain extension region extending between the channel region and the drain region, wherein the channel region is stressed by the source region and the drain region.

5. The semiconductor device of claim 4 wherein the source region and the drain region each comprise more arsenic than gallium.

6. The semiconductor device of claim 4 wherein the source region and the drain region each comprise more gallium than arsenic.

7. A method of manufacturing a semiconductor device, comprising:
- forming a gate over a silicon substrate, the gate including a gate electrode and an oxide layer, where a lower surface of the gate electrode is adjacent to an upper surface of the oxide layer;
- forming a source extension region in the substrate, the source extension region comprising at least one of germanium (Ge), carbon (C), or iron (Fe), an upper surface of the source extension region being adjacent to a lower surface of the oxide layer;
- forming a drain extension region in the substrate, the drain extension region comprising at least one of germanium (Ge), carbon (C), or iron (Fe), an upper surface of the drain extension region being adjacent to the lower surface of the oxide layer;
- etching a portion of the substrate to form a recessed source region adjacent to the source extension region and a recessed drain region adjacent to the drain extension region; and
- filling the recessed source region and the recessed drain region with a material comprising silicon, boron and phosphorous to form a source region and a drain region, the material being substantially free of carbon and a dopant level of boron and phosphorous in the material being more than $10^{20}$ atom/cm$^3$, a portion of an upper surface of the source region and a portion of an upper surface of the drain region being adjacent to the lower surface of the oxide layer and at least a portion of a lower surface of the source region and a portion of a lower surface of the drain region being adjacent to the silicon substrate, the source extension region extending between a channel region and the source region and the drain extension region extending between the channel region and the drain region, wherein the channel region between the source extension region and the drain extension region is stressed by the material filling the recessed source region and the recessed drain region.

8. The method of claim 7 further comprising depositing an etch stop layer over the silicon substrate to provide additional stress to the channel region.

9. The method of claim 7 wherein filling the recessed source region and the recessed drain region comprises using epitaxial deposition.

10. The method of claim 7 wherein the material comprises more phosphorous than boron.

11. The method of claim 7 further comprising forming a nickel layer on the gate and over the material filling the recessed drain region and the recessed source region.

12. The method of claim 7 further comprising annealing the semiconductor device.

13. A method of manufacturing a semiconductor device, comprising:
- forming a gate over a silicon substrate, the gate including a gate electrode and an oxide layer, where a lower surface of the gate electrode is adjacent to an upper surface of the oxide layer;
- forming a source extension region in the substrate, the source extension region comprising at least one of germanium (Ge), carbon (C), or iron (Fe), an upper surface of the source extension region being adjacent to a lower surface of the oxide layer;
- forming a drain extension region in the substrate, the drain extension region comprising at least one of germanium (Ge), carbon (C), or iron (Fe), an upper surface of the drain extension region being adjacent to the lower surface of the oxide layer;
- etching a portion of the substrate to form a recessed source region adjacent to the source extension region and a recessed drain region adjacent to the drain extension region; and
- filling the recessed source region and the recessed drain region with a material comprising silicon, arsenic and gallium to form a source region and a drain region, the material being substantially free of germanium and a dopant level of arsenic and gallium in the material being more than $10^{20}$ atom/cm$^3$, a portion of an upper surface of the source region and a portion of an upper surface of the drain region being adjacent to the lower surface of the oxide layer and at least a portion of a lower surface of the source region and a portion of a lower surface of the drain region being adjacent to the silicon substrate, the source extension region extending between a channel region and the source region and the drain extension region extending between the channel region and the drain region, wherein the channel region between the source extension region and the drain extension region is stressed by the material filling the recessed source region and the recessed drain region.

14. The method of claim 13 further comprising depositing an etch stop layer over the silicon substrate to provide additional stress to the channel region.

15. The method of claim 13 wherein filling the recessed source region and the recessed drain region comprises using epitaxial deposition.

16. The method of claim 13 further comprising forming a nickel layer on the gate and over the material filling the recessed drain region and the recessed source region.

17. The method of claim 13 further comprising annealing the semiconductor device.

* * * * *